(12) United States Patent
Suzuki (10) Patent No.: US 9,924,120 B2
(45) Date of Patent: Mar. 20, 2018

(54) PIXEL UNIT AND IMAGE SENSOR (71) Applicant: Atsushi Suzuki, Hyogo (JP)

(72) Inventor: Atsushi Suzuki, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/426,152

(22) Filed: Feb. 7, 2017

(65) Prior Publication Data
US 2017/0244919 A1 Aug. 24, 2017

(30) Foreign Application Priority Data

Feb. 23, 2016 (JP) ................. 2016-032187

(51) Int. Cl.
*H04N 3/14* (2006.01)
*H04N 5/335* (2011.01)
*H01L 27/00* (2006.01)
*H04N 5/374* (2011.01)
(Continued)

(52) U.S. Cl.
CPC ....... *H04N 5/374* (2013.01); *H01L 27/14605* (2013.01); *H01L 27/14612* (2013.01); *H01L 27/14643* (2013.01); *H04N 5/378* (2013.01)

(58) Field of Classification Search
CPC .... H04N 5/374; H04N 5/3741; H04N 5/3742; H04N 3/1512; H04N 5/3745; H04N 5/37452; H04N 5/37455; H04N 5/37457; H04N 5/3743; H01L 27/14643; H01L 27/14645; H01L 27/14647; H01L 27/14649; H01L 27/1465; H01L 27/14652; H01L 27/14609; H01L 27/1461;
(Continued)

(56) References Cited

U.S. PATENT DOCUMENTS 7,619,269 B2 * 11/2009 Ohkawa ............ H01L 27/10894
257/296
7,663,167 B2 * 2/2010 Ladd ................. H01L 27/14609
257/291
(Continued)

FOREIGN PATENT DOCUMENTS

JP 2013-225774 10/2013
JP 2015-106908 6/2015
JP 2015-130533 7/2015

*Primary Examiner* — Chia-Wei A Chen
(74) *Attorney, Agent, or Firm* — IPUSA, PLLC (57) ABSTRACT

A pixel unit includes a photoelectric conversion element; a first transistor, which is coupled to the photoelectric conversion element, configured to transfer an electric charge that has been subjected to photoelectric conversion at the photoelectric conversion element; a second transistor configured to reset the electric charge transferred by the first transistor; and a diffusion region including diffused impurities. The diffusion region accumulates the electric charge transferred from the first transistor. The diffusion region is disposed between the first and second transistors. The diffusion region includes a first region that is directly coupled to gates of the first and second transistors; and a second region that is adjacent to the first region, the second region being directly coupled to the gate of the first transistor and being coupled to the second transistor via the first region. The impurity concentration is lower in the second region than in the first region.

9 Claims, 7 Drawing Sheets (51) Int. Cl.
*H01L 27/146* (2006.01)
*H04N 5/378* (2011.01)

(58) Field of Classification Search
CPC ......... H01L 27/14612; H01L 27/14614; H01L 27/14616; H01L 27/14689
See application file for complete search history.

(56) References Cited

U.S. PATENT DOCUMENTS

| | | | | |
|---|---|---|---|---|
| 7,872,286 B2 * | 1/2011 | Okita | ................ | H01L 27/14603 257/291 |
| 9,640,571 B2 * | 5/2017 | Kim | ................ | H01L 27/14612 |
| 2004/0046193 A1 * | 3/2004 | Park | ................ | H01L 27/14603 257/292 |
| 2004/0141077 A1 * | 7/2004 | Ohkawa | ............ | H01L 27/14603 348/308 |
| 2004/0173864 A1 * | 9/2004 | Inagaki | ............. | H01L 27/14603 257/443 |
| 2005/0045926 A1 * | 3/2005 | Mouli | ................... | H01L 27/146 257/294 |
| 2006/0001061 A1 * | 1/2006 | Miyatake | ............... | H04N 3/155 257/292 |
| 2006/0081887 A1 * | 4/2006 | Lyu | ................... | H01L 27/14603 257/215 |
| 2008/0088724 A1 * | 4/2008 | Kudoh | ............. | H01L 27/14603 348/300 |
| 2010/0214460 A1 * | 8/2010 | Hasegawa | ........... | H04N 5/3698 348/300 |
| 2014/0347538 A1 * | 11/2014 | Toda | ................ | H01L 27/14603 348/308 |
| 2016/0006970 A1 * | 1/2016 | Itonaga | ............ | H01L 27/14603 348/300 |
| 2016/0013227 A1 * | 1/2016 | Kim | ................. | H01L 27/14612 257/229 |
| 2016/0172397 A1 * | 6/2016 | Ma | ................... | H01L 27/14614 257/292 |
| 2016/0219236 A1 * | 7/2016 | Maeda | ............... | H01L 27/1464 |
| 2017/0110499 A1 * | 4/2017 | Araki | ................ | H01L 27/14643 |

* cited by examiner

PIXEL UNIT AND IMAGE SENSOR

CROSS-REFERENCE TO RELATED APPLICATION

The present application claims the benefit of priority under 35 U.S.C. § 119 of Japanese Patent Application No. 2016-032187, filed on Feb. 23, 2016, the contents of which are incorporated herein by reference in their entirety.

BACKGROUND OF THE INVENTION

1. Field of the Invention

The present invention relates to a pixel unit and an image sensor.

2. Description of the Related Art

Solid-state image sensors such as a Complementary Metal Oxide Semiconductor (CMOS), etc., can be manufactured by using a manufacturing process of a typical semiconductor, and analog circuits and digital circuits can be mixed on the same chip. Therefore, a significant advantage can be attained in that peripheral integrated circuits (IC) can be reduced.

This kind of solid-state image sensor is formed of a pixel part in which a plurality of pixels are disposed, and peripheral circuits are disposed on the periphery of the pixel part. Each pixel includes a photoelectric conversion element of a photodiode (PD), a floating diffusion (FD) for converting electric charges, which have been subjected to photoelectric conversion, into a voltage, and a pixel transistor including various transistors.

The FD includes an FD diffusion layer (or a diffusion region), FD wirings, and a gate capacitance of an amplification transistor. It is known that the capacity of the entire FD affects the voltage conversion efficiency. For example, there is known a structure in which a high concentration region of FD diffusion is separated from the separation end, for the purpose of improving the conversion efficiency of the solid-state image sensor (see, for example, Patent Document 1).

Patent Document 1: Japanese Unexamined Patent Application Publication No. 2013-225774

SUMMARY OF THE INVENTION

An aspect of the present invention provides a pixel unit and an image sensor in which one or more of the above-described disadvantages are reduced.

According to one aspect of the present invention, there is provided a pixel unit including a photoelectric conversion element; a first transistor configured to transfer an electric charge that has been subjected to photoelectric conversion at the photoelectric conversion element, the first transistor being coupled to the photoelectric conversion element; a second transistor configured to reset the electric charge transferred by the first transistor; and a diffusion region including diffused impurities, the diffusion region being configured to accumulate the electric charge transferred from the first transistor, and the diffusion region being disposed between the first transistor and the second transistor, wherein the diffusion region includes a first region that is directly coupled to a gate of the first transistor and a gate of the second transistor; and a second region that is adjacent to the first region, the second region being directly coupled to the gate of the first transistor and being coupled to the second transistor via the first region, and wherein an impurity concentration in the second region is lower than an impurity concentration in the first region.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

The FD diffusion layer of a pixel forming the image sensor of the related art, receives the electric charges transferred from the PD via a transfer transistor. Accordingly, the FD diffusion layer has a fixed channel width in order to maintain the transfer characteristics. Therefore, the volume of the diffusion layer (the area of the diffusion region) increases, which leads to an increase in the capacity of the entire FD, and the voltage conversion efficiency decreases. As a result, problems have occurred in that noise is promoted and signal-to-noise (SN) characteristics are deteriorated.

A problem to be solved by an embodiment of the present invention is to provide a pixel unit by which the voltage conversion efficiency can be improved, while maintaining the transfer characteristics of the image sensor.

Embodiments of the present invention will be described by referring to the accompanying drawings.

Figure 1:
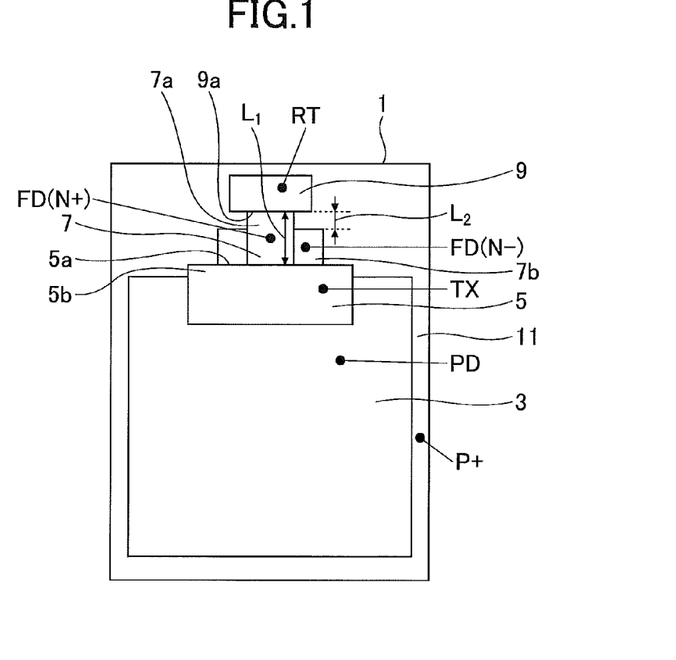
FIG. 1 illustrates a structure of an example of a pixel unit according to a first embodiment of the present invention.

FIG. 1 illustrates a structure of a pixel that is an example of a pixel unit according to a first embodiment of the present invention. A pixel 1 includes a photodiode (PD) 3, a transfer transistor (TX) 5, a floating diffusion region (FD region) 7, and a reset transistor (RT) 9.

The photodiode 3 is electrically coupled to the transfer transistor 5 and has a function of converting light into electric charges.

The transfer transistor 5 is disposed between the photodiode 3 and the floating diffusion region 7, and is electrically coupled to the photodiode 3 and the floating diffusion region 7. The transfer transistor 5 has a function of transferring the electric charges, which have been converted by the photodiode 3, to the floating diffusion region 7.

The floating diffusion region 7 is disposed between the transfer transistor 5 and the reset transistor 9, and is electrically coupled to the transfer transistor 5 and the reset transistor 9. The floating diffusion region 7 includes impurities in a diffused manner. In the floating diffusion region 7, electric charges transferred from the transfer transistor 5 are accumulated.

The reset transistor 9 is electrically coupled to the floating diffusion region 7. The reset transistor 9 has a function of resetting (voltage conversion) the potential of the electric charges accumulated in the floating diffusion region 7, to a rest potential.

Note that the photodiode 3 is an example of a photoelectric conversion element forming the pixel unit according to an embodiment of the present invention. The transfer transistor 5 is an example of a first transistor forming the pixel unit according to an embodiment of the present invention. The floating diffusion region 7 is an example of a diffusion region forming the pixel unit according to an embodiment of the present invention. Furthermore, the reset transistor 9 is an example of a second transistor forming the pixel unit according to an embodiment of the present invention.

The floating diffusion region 7 is formed of two regions having different concentrations of diffused impurities. Among these regions, the region having a higher impurity concentration is a high concentration region 7a, and the region having a lower impurity concentration is a low concentration region 7b. Furthermore, the impurity concentration of the high concentration region 7a may be set as greater than or equal to $1 \times 10^{19}$ cm$^{-3}$, and the impurity concentration of the low concentration region 7b may be set as less than $1 \times 10^{19}$ cm$^{-3}$.

The high concentration region 7a is directly coupled to a gate 5a of the transfer transistor 5 and a gate 9a of the reset transistor 9. As described below, the high concentration region 7a can be coupled to the bottom part of the gate 5a of the transfer transistor 5, to form a region (N+) where the impurity concentration is high and the area is small.

The low concentration region 7b is disposed so as to be adjacent to the high concentration region 7a, and directly coupled to the gate 5a of the transfer transistor 5, and coupled to the gate 9a of the reset transistor 9 via the high concentration region 7a. In other words, the low concentration region 7b is directly coupled to the transfer transistor 5, but is not directly coupled to the reset transistor 9. The low concentration region 7b is formed of a region (N−) in which the impurity concentration is lower than the impurity concentration of the high concentration region (N+).

Note that the high concentration region 7a is an example of a first region among the diffusion regions forming the pixel unit according to an embodiment of the present invention, and the low concentration region 7b is an example of a second region among the diffusion regions.

By providing the above high concentration region and the low concentration region, the junction capacitance (diffusion capacitance) between the transfer transistor and the reset transistor can be reduced in the entire floating diffusion. Therefore, the conversion efficiency of the image sensor can be improved.

Furthermore, the electric charges, which are collected in the low concentration region where the potential is shallow, are collected in the high concentration region where the potential is deep. Therefore, it is possible to mitigate the decrease in the transfer efficiency.

In the process of manufacturing CMOS, a separation region 11 is formed on the periphery of the floating diffusion region 7. The separation region 11 is for separating the parts other than the floating diffusion region 7, from the floating diffusion region 7. The separation region 11 forms a P type region (P+). The separation region 11 is an example of an element separation region according to an embodiment of the present invention.

The parts other than the floating diffusion region 7 are the parts excluding the part where the floating diffusion region 7 is coupled to the transfer transistor 5 and the part where the floating diffusion region 7 is coupled to the reset transistor 9, in the pixel 1. The part where the floating diffusion region 7 is coupled to the transfer transistor 5 corresponds to the gate 5a of the transfer transistor 5. The part where the floating diffusion region 7 is coupled to the reset transistor 9 corresponds to the gate 9a of the reset transistor 9.

In the separation region 11 as described above, crystal defects (or lattice defects) are likely to occur inside, when manufacturing the CMOS. Therefore, when the separation region is adjacent to the diffusion region, particularly adjacent to the high concentration region, a dark current is likely to be generated, and the conversion efficiency may decrease. Therefore, the low concentration region 7b is preferably disposed between the high concentration region 7a and the separation region 11, in order to separate the high concentration region 7a and the separation region 11 from each other. By disposing the low concentration region 7b at the above position, the generation of a dark current can be mitigated, and the decrease in the conversion efficiency can be reduced.

The floating diffusion region 7 is preferably disposed such that the high concentration region 7a and the low concentration region 7b have the following positional relationship. For example, as illustrated in FIG. 1, L1 is the length from the gate 5a of the transfer transistor 5 to the gate 9a of the reset transistor 9, to which the high concentration region 7a is directly coupled. Furthermore, L2 is the length from the end of the low concentration region 7b facing the reset transistor 9 to the gate 9a of the reset transistor 9.

Here, the positional relationship between the high concentration region 7a and the low concentration region 7b is preferably set such that the value of L2/L1 is minimized. By disposing the high concentration region 7a and the low concentration region 7b in such a positional relationship, it is possible to surely attain the effect of improving the conversion efficiency while maintaining the transfer characteristics.

Furthermore, in the plan view of FIG. 1, the low concentration region 7b is adjacent to the high concentration region 7a so as to sandwich the high concentration region 7a. By disposing the low concentration region 7b with respect to the high concentration region 7a in this way, the low concentration region 7b can be disposed near the part where the floating diffusion region 7 is coupled to the transfer transistor 5 (the part where a dark current is likely to be generated). Thus, it is possible to mitigate the generation of a dark current while decreasing the diffusion capacitance of the floating diffusion FD, and therefore the conversion efficiency can be surely improved.

Furthermore, the part where the floating diffusion region 7 is coupled to the transfer transistor 5 is formed by the high concentration region 7a and the low concentration region 7b, and therefore the source of the floating diffusion region 7 can be increased. As a result, the transfer characteristics of the electric charges can also be improved.

The impurity concentration in the low concentration region 7b in the floating diffusion region 7 is lower than the concentration in a low concentration region having a regular lightly doped drain (LDD) structure. Furthermore, the low concentration region 7b has a larger area than a low impurity concentration region near the junction that is naturally formed by the formation of a regular positive-negative (P-N) junction.

On the other hand, a part of the high concentration region 7a in the floating diffusion region 7 forms a contact region, which becomes a part of the transfer transistor 5 in a state where the floating diffusion region 7 is coupled to the transfer transistor 5. Said differently, a part of the transfer transistor 5 also acts as a part of the high concentration region 7a in the floating diffusion region 7.

Furthermore, a part of the transfer transistor 5 is preferably formed as an extension part 5b that extends from the photodiode 3 toward the floating diffusion region 7. As illustrated in FIG. 1, the extension part 5b is formed so as to protrude toward the floating diffusion region 7 from the end of the photodiode 3 on the side of the transfer transistor 5, so as to overlap with a part of the floating diffusion region 7. By the extension part 5b, the area of the high concentration region 7a in the floating diffusion region 7 can be reduced.

That is, the extension part 5b becomes the part (contact region) where the high concentration region 7a in the floating diffusion region 7 is directly coupled to the transfer transistor 5. Said differently, a part of the transfer transistor 5 becomes a part of the high concentration region 7a, and therefore the area of the high concentration region 7a can be reduced.

The high concentration region 7a is unnecessary at positions other than the position where the contact region is substantially placed. In the typical process of manufacturing CMOS, the high concentration region 7a is formed by injecting impurities by using a resist mask, and therefore the high concentration region 7a has a sufficiently larger area than the contact area of the contact region. On the other hand, an increase in the area of the floating diffusion region 7 may cause an increase in the diffusion capacitance (the so-called junction capacitance) in the floating diffusion, and the conversion efficiency may decrease.

Therefore, in the present example, as illustrated in FIG. 1, the N-type high concentration region 7a is formed in the floating diffusion region 7. The high concentration region 7a is a region in the floating diffusion region 7 where the contact region, which is coupled to the gate 5a of the transfer transistor 5 (a region where electric charges are substantially likely to be accumulated), is shared with the transfer transistor 5. The impurity concentration distribution is set such that the regions of the floating diffusion region 7 other than the high concentration region 7a, become the N-type low concentration region 7b.

Compared to the high concentration region 7a, the junction capacitance in the low concentration region 7b is significantly small. Therefore, the overall junction capacitance decreases and the conversion efficiency increases in the floating diffusion region 7. Furthermore, the electric charges, which have been transferred from the photodiode 3 to the low concentration region 7b where the potential is shallow in the floating diffusion region 7, are collected into the high concentration region 7a where the potential is deep, and therefore the transfer efficiency can also be maintained.

Figure 2:
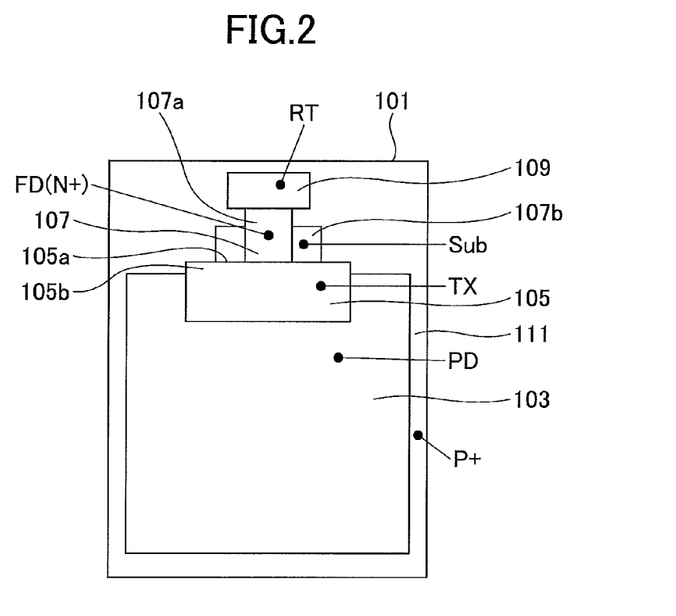
FIG. 2 illustrates a structure of an example of a pixel unit according to a second embodiment of the present invention.

Referring to FIG. 2, a description is given of a configuration of another example of the pixel unit according to a second embodiment of the present invention. Note that in FIG. 2, the parts, which are common to those of the first embodiment illustrated in FIG. 1, are denoted by reference numerals obtained by adding 100 to the corresponding reference numerals of FIG. 1, and descriptions of these common parts are omitted. In a pixel 101 illustrated in FIG. 2, a low concentration region 107b is formed by a part of a semiconductor substrate (Sub).

In the semiconductor substrate (Sub), the impurity concentration sufficiently lower than that in the high concentration region. Therefore, by forming the low concentration region 107b of a floating diffusion region 107 with a part of the semiconductor substrate (Sub), it is possible to reduce the diffusion capacitance components in the floating diffusion region 107. Therefore, the overall junction capacitance in the floating diffusion region 107 decreases, and the conversion efficiency increases.

Furthermore, by forming the low concentration region 107b with a part of the semiconductor substrate (Sub) described above, there is no need to use other members for forming the low concentration region of the floating diffusion. That is, a low concentration region can be provided by using a conventional CMOS manufacturing process (etching, etc.), and therefore manufacturing costs can be suppressed.

Figure 3:
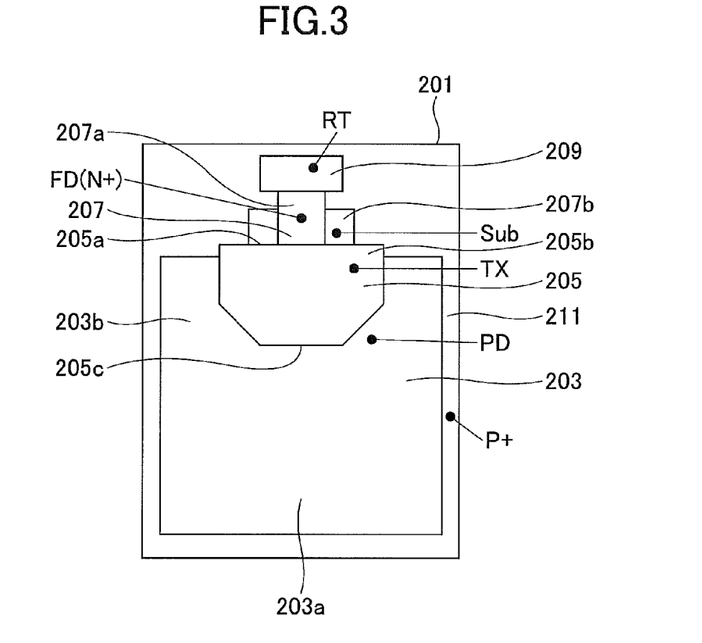
FIG. 3 illustrates a structure of an example of a pixel unit according to a third embodiment of the present invention.

Referring to FIG. 3, a description is given of a configuration of yet another example of the pixel unit according to a third embodiment of the present invention. Note that in FIG. 3, the parts, which are common to those of the first embodiment illustrated in FIG. 1, are denoted by reference numerals obtained by adding 200 to the corresponding reference numerals of FIG. 1, and descriptions of these common parts are omitted. In a pixel 201 illustrated in FIG. 3, a transfer transistor 205 includes a protruding part 205c protruding toward a photodiode 203 in a plan view.

As a protruding part is formed in the transfer transistor 205, the length from the photodiode 203 to a floating diffusion region 207 (a gate 205a of the transfer transistor 205) becomes substantially uniform. As a result, the potential in the region of the photodiode 203 adjacent to the transfer transistor 205 becomes substantially uniform. Therefore, the transfer electric field is enhanced in between a part 203a in the photodiode 203 that is away from the transfer transistor 205, and a part 203b adjacent to the transfer transistor 205. Therefore, the transfer characteristics of the image sensor can be improved.

Figure 4:
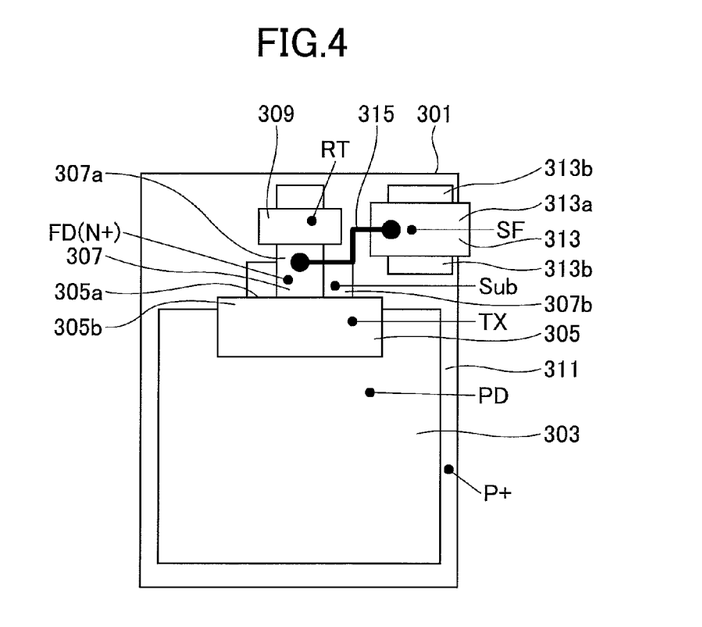
FIG. 4 illustrates a structure of an example of a pixel unit according to a fourth embodiment of the present invention.

Referring to FIG. 4, a description is given of a configuration of yet another example of the pixel unit according to a fourth embodiment of the present invention. Note that in FIG. 4, the parts, which are common to those of the first embodiment illustrated in FIG. 1, are denoted by reference numerals obtained by adding 300 to the corresponding reference numerals of FIG. 1, and descriptions of these common parts are omitted. In a pixel 301 illustrated in FIG. 4, an amplification transistor (SF) 313 is further provided.

The amplification transistor 313 is coupled to a floating diffusion region 307, and amplifies the signal voltage that has been converted at the floating diffusion region 307. The amplification transistor 313 is an example of a third transistor according to an embodiment of the present invention.

The amplification transistor 313 is formed of a gate 313a and a drain/source diffusion 313b. Among these, the gate 313a becomes the gate capacitance in the FD capacitance. Among the regions in a floating diffusion region 307, a high concentration region 307a is coupled to the gate 313a via a metal wiring 315.

By providing the amplification transistor as described above, the transfer characteristics of the pixel are improved, and the FD capacitance in the entire floating diffusion FD can be suppressed. Therefore, the conversion efficiency can be increased. Furthermore, by providing the amplification transistor as described above, the amplified electric signals can be output to the outside, and therefore it is easy to assemble an image sensor combined with other pixels.

Figure 5:
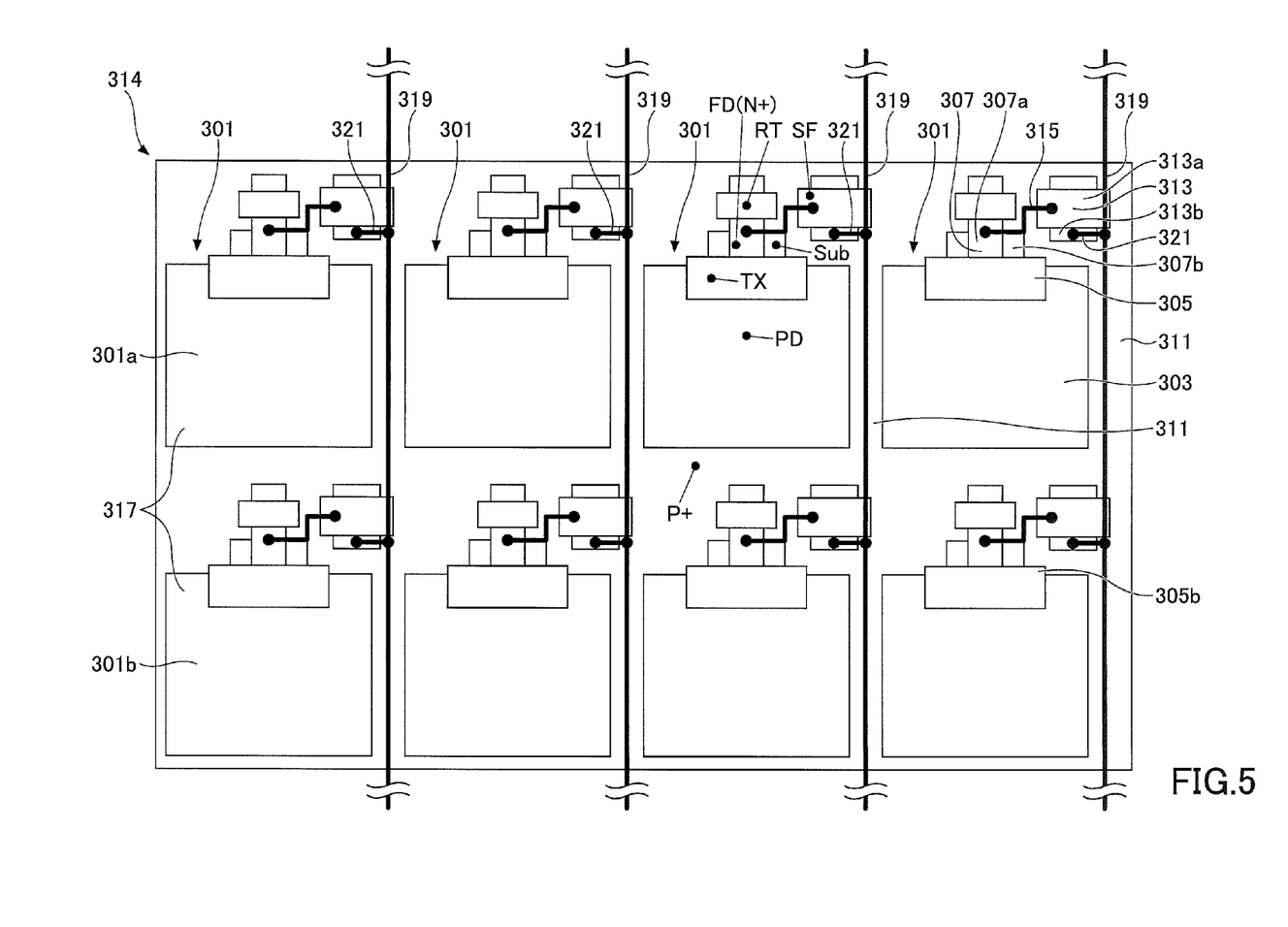
FIG. 5 illustrates an example of an image sensor (pixel part) using the pixel units according to the fourth embodiment illustrated in FIG. 4, in which a part of the image sensor is omitted.

FIG. 5 illustrates an example of a pixel part in which the pixels according to the fourth embodiment illustrated in FIG. 4 are arranged. Note that in FIG. 5, to facilitate understanding, a large part of the pixel part is omitted and only a part of the pixel part is described. In a pixel part 314 illustrated in FIG. 5, among a plurality of the pixels 301, some of the plurality of the pixels (pixels 301a and 301b) are disposed side by side in a row in a perpendicular direction (vertical direction) in a plan view, to form a pixel group 317. Furthermore, a plurality of these pixel groups 317 are disposed side by side in a row in a horizontal direction in a plan view in FIG. 5.

Each of the pixels 301a and 301b forming the pixel group 317 is coupled to one perpendicular signal line 319 with respect to each pixel group 317, via a metal wiring 321. The perpendicular signal line 319 has a function of reading an electric signal output from each pixel 301 and sending the electric signal to a read signal processing unit (read signal processing unit 527 of FIG. 7 described below).

Note that the pixel group 317 is an example of a pixel unit row according to an embodiment of the present invention. Furthermore, the perpendicular direction is an example of a first direction according to an embodiment of the present invention, and the horizontal direction is an example of a second direction that is orthogonal to the first direction. Furthermore, the perpendicular signal line 319 is an example of a signal line according to an embodiment of the present invention.

The direction of arranging the pixels forming the pixel group and the direction of arranging the pixels groups are not limited. However, as in the present example, by arranging the pixels in a perpendicular direction to form a pixel group, and by disposing the pixel groups in a horizontal direction, it is possible to dispose a plurality of pixels at high density in the pixel part. Furthermore, the length of each perpendicular signal line can be made short. As a result, it is possible to provide a solid-state image sensor having high resolution, in which the transfer characteristics are improved, the incident light is not blocked, and the saturation is not deteriorated.

Figure 6:
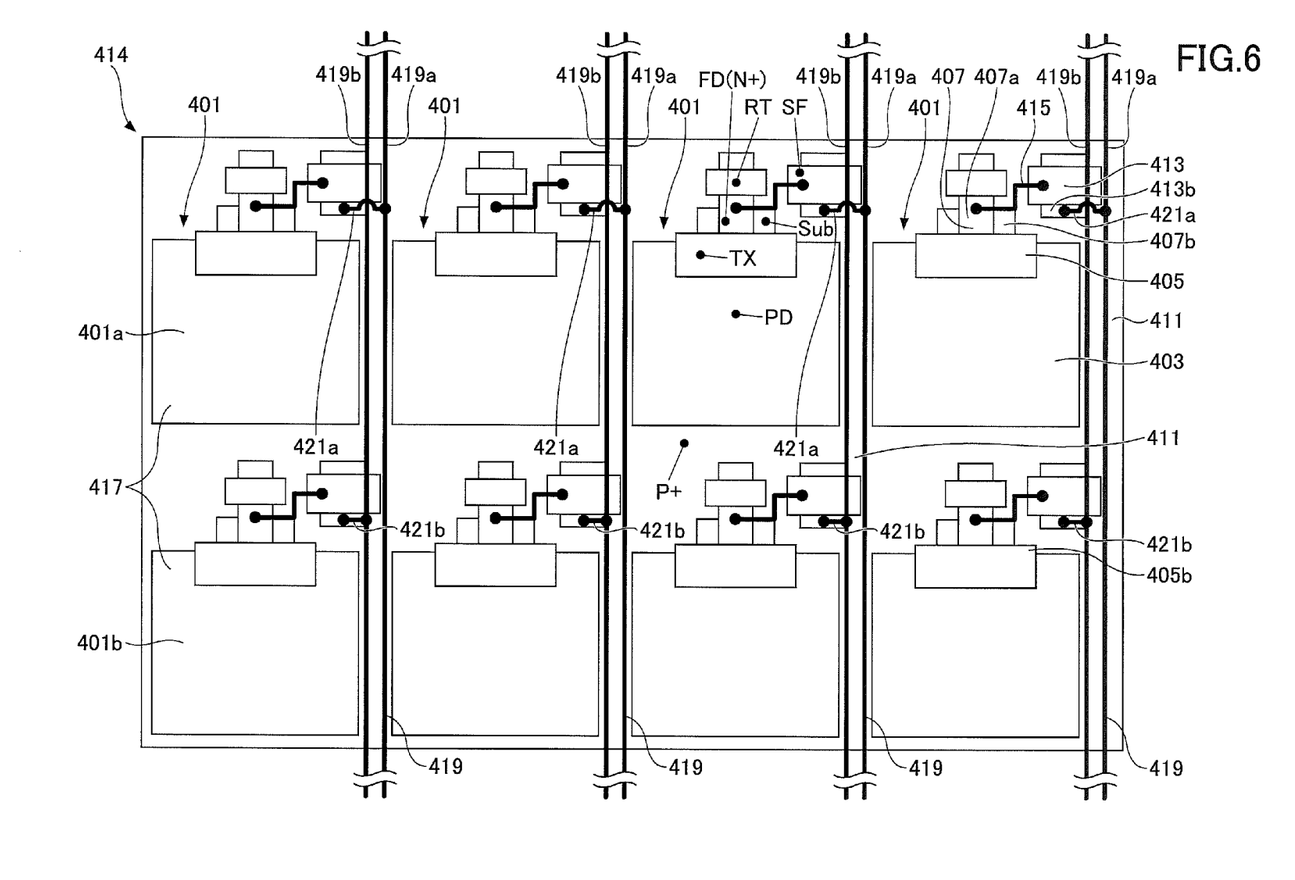
FIG. 6 illustrates another example of an image sensor (pixel part) using the pixel units according to the fourth embodiment illustrated in FIG. 4, in which a part of the image sensor is omitted.

FIG. 6 illustrates another example of a pixel part in which the pixels according to the fourth embodiment illustrated in FIG. 4 are arranged. Note that also in FIG. 6, similar to FIG. 5, a large part of the pixel part is omitted and only a part of the pixel part is described. Furthermore, in FIG. 6, the parts, which are common to those in FIG. 5, are denoted by reference numerals obtained by adding 100 to the corresponding reference numerals of FIG. 5, and descriptions of these common parts are omitted.

In a pixel part 414 illustrated in FIG. 6, each of the pixels 401 forming a pixel group 417 is coupled to one perpendicular signal line 419 with respect to each pixel 401. Specifically, a pixel 401a, among the pixels 401 forming the pixel group 417, is coupled to a perpendicular signal line 419a via a metal wiring 421a, and a pixel 401b is coupled to a perpendicular signal line 419b via a metal wiring 421b.

According to the above connections of pixels and perpendicular signal lines, it is possible to simultaneously read signals of pixels. Therefore, the image sensor can be operated at high speed, and the transfer characteristics are further improved.

Figure 7:
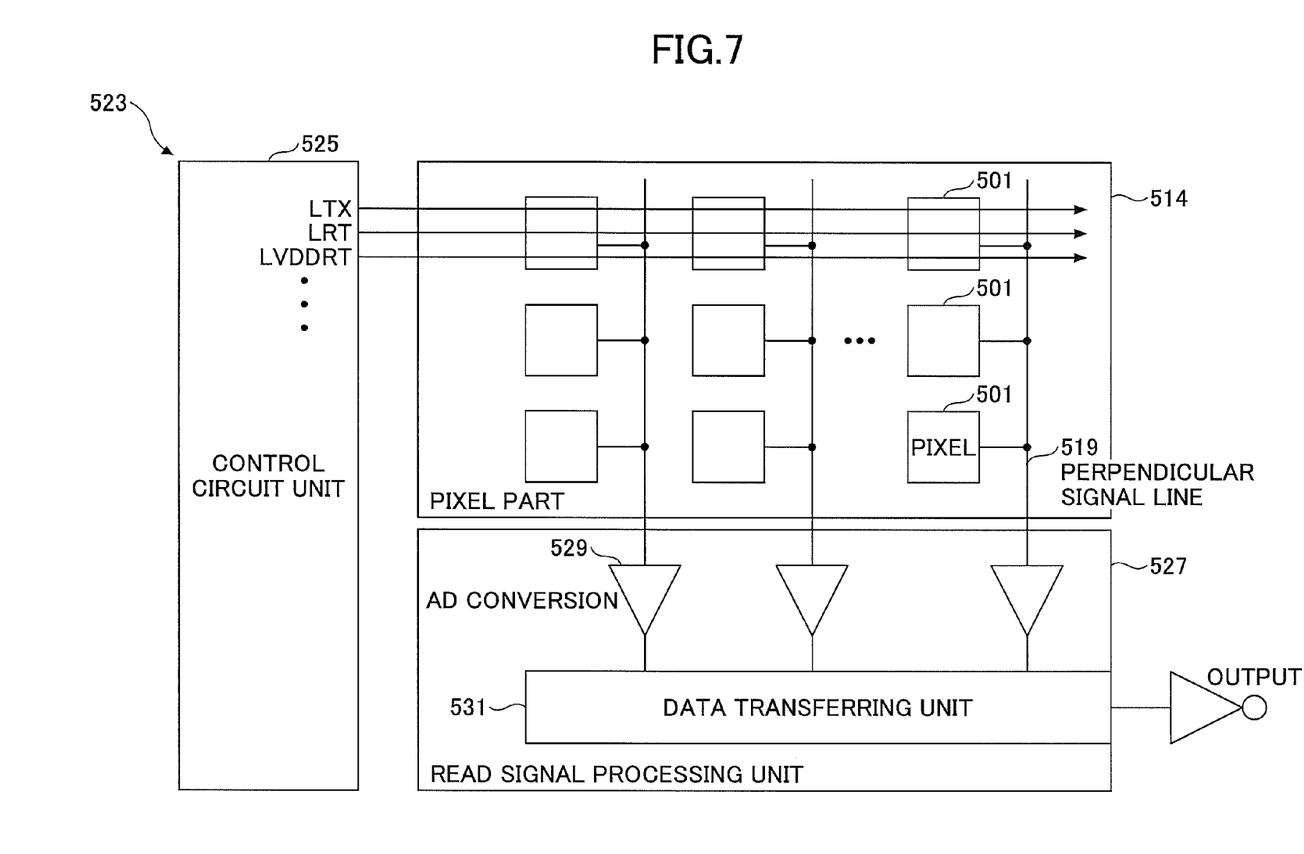
FIG. 7 is a schematic block diagram of an example of an image sensor using the pixel unit according to an embodiment of the present invention.

Here, a description is given of operations of the image sensor (solid-state image sensor) to which the pixel unit according to an embodiment of the present invention is applied. FIG. 7 illustrates a schematic configuration of the image sensor (solid-state image sensor) including the pixel unit according to an embodiment of the present invention. Note that in FIG. 7, the parts, which are common to those of the FIG. 5, are denoted by reference numerals obtained by adding 200 to the corresponding reference numerals of FIG. 5, and descriptions of these common parts are omitted.

In a solid-state image sensor 523 according to the present example, the main parts are formed by a control circuit unit 525, a pixel part 514, and the read signal processing unit 527.

The control circuit unit 525 is coupled to the pixel part 514, and sends driving signals for driving the pixel part 514, to the pixel part 514.

The pixel part 514 is formed by disposing a plurality of pixels 501 indicating examples of the pixel units according to an embodiment of the present invention. The pixel part 514 is further coupled to the read signal processing unit 527 via a perpendicular signal line 519 to which each of the pixels 501 are coupled. The pixel part 514 is driven by driving signals from the control circuit unit 525, and accordingly, the pixel part 514 sends the output signals output from each of the pixels 501 to the read signal processing unit 527.

The read signal processing unit 527 includes a reading circuit 529 for reading the output signals of the pixels 501, and a data transferring unit 531 for outputting the output signals read by the reading circuit 529 outside, as signal data.

As the reading circuit 529, an analog amplifier may be used in a case of reading the output signals as analog signals, and an analog to digital (AD) conversion circuit may be used in a case of reading the output signals as digital signals. In the present example, an AD conversion circuit is provided as the reading circuit 529 as illustrated in FIG. 7.

As the data transferring unit 531, an output amplifier for analog output may be used, in a case where the signals processed by the read signal processing unit 527 are analog signals. Furthermore, as the data transferring unit 531, a differential amplifier circuit for digital data may be used in a case where of digital signals digitized by an AD conversion circuit. In the present example, a differential amplifier circuit is provided as the data transferring unit 531.

Figure 8:
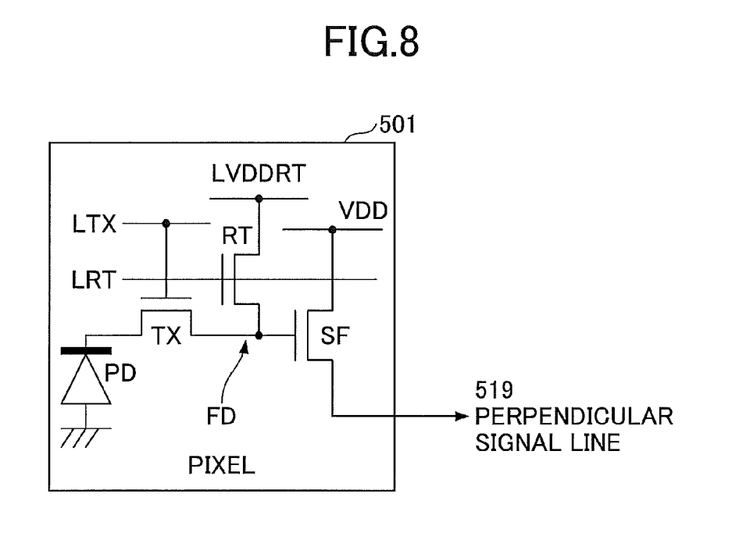
FIG. 8 illustrates a circuit configuration of a pixel forming the pixel part of the image sensor illustrated in FIG. 7.

FIG. 8 illustrates a circuit configuration of the pixel 501 forming the pixel part 514 of the image sensor illustrated in FIG. 7. The pixel 501 includes a photodiode PD, a transfer transistor TX, a reset transistor RT, an amplification transistor SF, and a floating diffusion FD. The pixel 501 further includes a power source VDD, a control line (transfer control line) LTX of the transfer transistor TX, a control line LRT (reset control line) of the reset transistor RT, and a reset power source control line LVDDRT of the reset transistor RT.

The transfer transistor TX is coupled in between the photodiode PD and the floating diffusion FD acting as an output node. As driving signals are applied to the transfer control line LTX from the control circuit unit 525, the transfer transistor TX transfers the electric charges (or electrons), which have been subjected to photoelectric conversion at the floating diffusion FD, to the floating diffusion FD.

The reset transistor RT is coupled in between the reset power source control line LVDDRT and the floating diffusion FD. In this reset transistor RT, driving signals for resetting are applied from the control circuit unit 525 to the gate of the reset transistor RT through the reset control line LRT. Accordingly, the potential of the floating diffusion FD is reset by the potential of the reset power source control line LVDDRT.

The floating diffusion FD is coupled to the gate of the amplification transistor SF, in a state of being coupled in between the transfer transistor TX and the reset transistor RT.

The amplification transistor SF is coupled to the perpendicular signal line 519, and forms a source follower with a current generator outside the pixel part 514. The amplification transistor SF amplifies the potential of the floating diffusion FD, and outputs a voltage according to the amplified potential to the perpendicular signal line 519. The voltage that has been output from the pixels 501, is output to the read signal processing unit 527, through the perpendicular signal line 519.

The reset control line LRT, the transfer control line LTX, and the reset power source control line LVDDRT that are wired in the pixel part 514 form a group of lines, and each group is wired for one of the rows in which a plurality of pixels are arranged, as illustrated in FIG. 7. The reset control line LRT, the transfer control line LTX, and the reset power source control line LVDDRT are driven by the control circuit unit 525.

Figure 9:
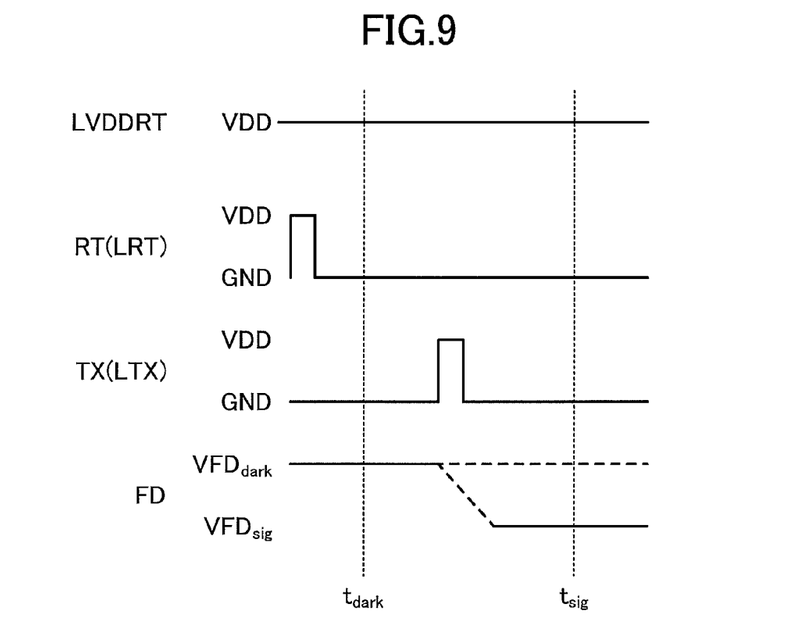
FIG. 9 is for describing the operation timings of the pixel unit forming the image sensor illustrated in FIG. 7.

Next, referring to FIG. 9, a description is given of the operation timings of the pixels forming the pixel part of the image sensor of an example of the present invention. The operations illustrated in FIG. 9 correspond to the respective nodes in the circuit diagram of FIG. 8. Furthermore, the operations express the operations during a time including a time $t_{dark}$ of reading a reset signal of the pixel 501 and a time $t_{sig}$ of reading a signal level of the pixel 501.

The reset power source control line LVDDRT forms the power source VDD. Accordingly, the operation of reading the pixels of the pixel part 514 becomes effective. Next, a test signal input gate TFD (not illustrated) is connected to ground. Accordingly, an amplification transistor TSF of a test output signal unit (not illustrated) and a perpendicular signal line are disconnected, and output signals from the pixels 501 of the pixel part 514 are read.

A description is given of the operation of reading output signals of the pixels 501 in time series. First, before the time $t_{dark}$ of reading a reset signal, the reset control line LRT of the reset transistor RT is set to have a voltage VDD of a H level. Accordingly, the potential of the floating diffusion FD is reset to a reset potential $VFD_{dark}$.

At the time $t_{dark}$ of reading a reset signal, the read signal processing unit 527 reads the potential level $VFD_{dark}$ of the floating diffusion FD reset by the reset voltage, as an output signal output from the amplification transistor SF to the perpendicular signal line 519.

Subsequently, before the time $t_{sig}$ of reading a signal level, the transfer transistor TX is set to have a voltage VDD of a H level by the transfer control line LTX, and electrons (electric charges) accumulated at the photodiode PD are transferred to the floating diffusion FD (electric charge transfer).

At the time $t_{sig}$ of reading a signal level, the read signal processing unit 527 reads the voltage $VFD_{sig}$ of the signal level, which has been changed according to the number of electrons transferred by the electric charge transfer and the FD capacitance, as the output signal output from the amplification transistor SF to the read signal processing unit 527.

Figure 10:
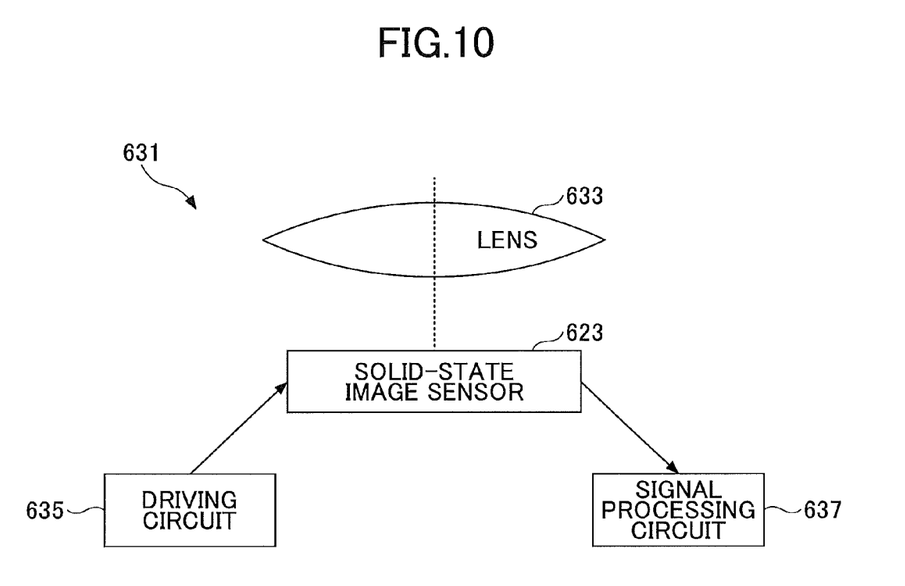
FIG. 10 illustrates an example of a camera system using the image sensor including the pixel unit according to an embodiment of the present invention.

FIG. 10 illustrates an example of a camera system to which the image sensor according to an embodiment of the present invention is applied. In a camera system 631 of FIG. 10, the main parts are formed by a solid-state image sensor 623, a lens 633, a driving circuit 635, and a signal processing circuit 637. Note that as the solid-state image sensor 623, the solid-state image sensor illustrated in FIGS. 5 through 7 may be used.

The lens 633 can focus the incident light on the imaging surface in a pixel region of the solid-state image sensor 623, and the lens 633 forms an optical system of camera lenses.

The driving circuit 635 can drive the solid-state image sensor 623, and the driving circuit 635 forms a driving unit of the camera system.

The signal processing circuit 637 can perform a predetermined signal process on output signals output from the solid-state image sensor 623, and the signal processing circuit 637 forms a signal processing unit of the camera system.

When the image signals processed by the signal processing circuit 637 are output as analog signals, the image signals are passed through an analog/digital conversion circuit (analog front end (AFE)). When the image signals processed by the signal processing circuit 637 are output as digital signals, the image signals are passed through a digital signal process (digital front end (DFE)). Then, the image signals are recorded in a recording medium such as a memory. The image information recorded in the recording medium is hard-copied (physically copied) by a printer. Furthermore, the image signals processed in the signal processing unit are projected as a video on a monitor such as a liquid crystal display.

As described above, by installing the above solid-state image sensor in the imaging device, the above effects of the solid-state image sensor can be attained (an effect of improving the voltage conversion efficiency while maintaining or improving the transfer efficiency of the image sensor), and therefore a camera having high precision can be realized.

According to one embodiment of the present invention, a pixel unit is provided, by which the conversion efficiency can be improved, while maintaining the transfer characteristics of the image sensor.

The pixel unit and the image sensor are not limited to the specific embodiments described in the detailed description, and variations and modifications may be made without departing from the spirit and scope of the present invention.

What is claimed is:

1. A pixel unit comprising:
   a photoelectric conversion element;
   a first transistor configured to transfer an electric charge that has been subjected to photoelectric conversion at the photoelectric conversion element, the first transistor being coupled to the photoelectric conversion element;
   a second transistor configured to reset the electric charge transferred by the first transistor; and
   a diffusion region including diffused impurities, the diffusion region being configured to accumulate the electric charge transferred from the first transistor, and the diffusion region being disposed between the first transistor and the second transistor,
   wherein the diffusion region includes:
      a first region that is directly coupled to a gate of the first transistor and a gate of the second transistor; and
      a second region that is adjacent to the first region, the second region being directly coupled to the gate of the first transistor and being coupled to the second transistor via the first region, and
   wherein an impurity concentration in the second region is lower than an impurity concentration in the first region.

2. The pixel unit according to claim 1, wherein
an element separation region is provided on a periphery of the diffusion region, and
the second region is disposed between the first region and the element separation region so as to separate the first region and the element separation region from each other.

3. The pixel unit according to claim 1, wherein the second region is adjacent to the first region so as to sandwich the first region in a plan view.

4. The pixel unit according to claim 1, wherein
the first transistor, the second transistor, and the first region are formed on a semiconductor substrate, and
the second region is formed by a part of the semiconductor substrate.

5. The pixel unit according to claim 1, further comprising:
a third transistor configured to amplify a signal voltage that has been converted in the diffusion region, the third transistor being coupled to the diffusion region.

6. The pixel unit according to claim 1, wherein a part of the diffusion region is formed by a part of the first transistor.

7. The pixel unit according to claim 1, wherein a part of the first transistor includes an extension part that extends toward the diffusion region from the photoelectric conversion element.

8. An image sensor in which a plurality of the pixel units according to claim 1 are disposed, wherein
at least two of the pixel units are disposed side by side in a first direction to form a pixel unit row, and
a plurality of the pixel unit rows are disposed side by side in a second direction that is orthogonal to the first direction.

9. The image sensor according to claim 8, wherein the at least two of the pixel units forming the pixel unit row are coupled to one signal line for reading an electric signal of the at least two of the pixel units.

* * * * *